United States Patent
Bollati et al.

(10) Patent No.: US 7,602,250 B2
(45) Date of Patent: Oct. 13, 2009

(54) LOW NOISE AC DIFFERENTIAL AMPLIFIER WITH REDUCED LOW CORNER FREQUENCY AND CURRENT CONSUMPTION

(75) Inventors: Giacomino Bollati, Castel San Giovanni (IT); Guido Gabriele Albasini, Voghera (IT)

(73) Assignee: STMicroelectronics S.r.l., Agrate Brianza (MI) (IT)

( * ) Notice: Subject to any disclaimer, the term of this patent is extended or adjusted under 35 U.S.C. 154(b) by 21 days.

(21) Appl. No.: 12/017,694

(22) Filed: Jan. 22, 2008

(65) Prior Publication Data
US 2008/0211580 A1 Sep. 4, 2008

(30) Foreign Application Priority Data
Jan. 23, 2007 (IT) .......................... VA2007A0013

(51) Int. Cl.
H03F 1/14 (2006.01)
(52) U.S. Cl. ....................................... 330/292; 330/261
(58) Field of Classification Search ................. 330/292, 330/252, 261, 257
See application file for complete search history.

(56) References Cited

U.S. PATENT DOCUMENTS

| 4,974,916 | A | * | 12/1990 | Donig | 330/252 |
| 5,729,176 | A | * | 3/1998 | Main et al. | 330/252 |
| 6,717,467 | B2 | * | 4/2004 | Renous et al. | 330/253 |

FOREIGN PATENT DOCUMENTS

EP 1511170 3/2005

* cited by examiner

*Primary Examiner*—Henry K Choe
(74) *Attorney, Agent, or Firm*—Lisa K. Jorgenson; Allen, Dyer, Doppelt, Milbrath & Gilchrist, P.A.

(57) ABSTRACT

An integrated amplifier may include a transconductance stage including a differential pair of input transistors of a first type of conductivity, respective resistive loads coupled to said input transistors, and a first bias circuit coupled to the input transistors. The first bias circuit may include a second differential pair of bias transistors having first conduction terminals coupled in common and second conduction terminals coupled to respective conduction terminals of the input transistors. The first bias circuit may also include respective second bias circuits coupled to the bias transistors to enable the input transistors in a conduction state with the input transistors being biased by a same respective bias current that flows through the respective input transistors. The first bias circuit may also include a capacitive network coupled to the bias transistors to define with the input transistors a feedback loop.

20 Claims, 20 Drawing Sheets

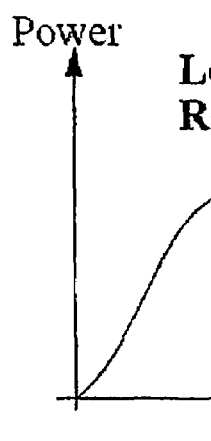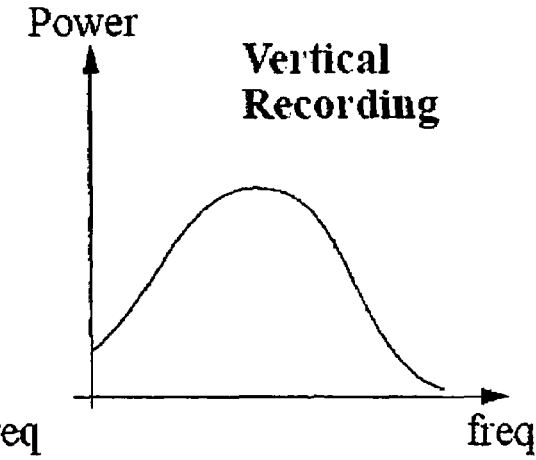
FIG. 1A
PRIOR ART
FIG. 1B
PRIOR ART
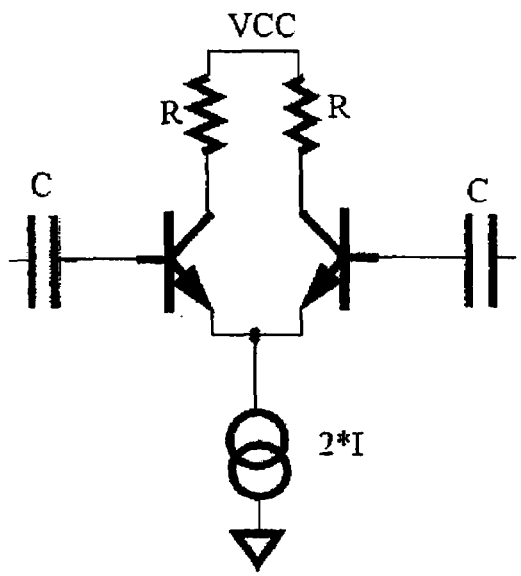
FIG. 2
PRIOR ART

# LOW NOISE AC DIFFERENTIAL AMPLIFIER WITH REDUCED LOW CORNER FREQUENCY AND CURRENT CONSUMPTION

FIELD OF THE INVENTION

This invention relates to AC amplifiers, and more particularly, to a low noise differential AC amplifier with reduced low corner frequency and reduced current consumption.

BACKGROUND OF THE INVENTION

In many applications it may be desirable to amplify an AC signal superimposed to a relatively large DC component. In these cases, an AC amplifier input with this signal through decoupling capacitors is commonly used. In particular, this happens in signal channels for recording data in hard disk drives (HDD).

Two modes of recording data on a HDD are the so-called longitudinal recording and the vertical recording. As far as the AC amplifier is concerned, the main difference between these two techniques is that when using the longitudinal recording technique, a typical spectrum of an AC signal to be amplified, differs relevantly from the spectrum of the corresponding signal when using the vertical recording technique. As may be observed by comparing the two diagrams of FIG. 1, signals used for recording data on a HDD using the vertical recording technique have a non-negligible power content at low frequencies.

Therefore, the pass-band of AC amplifiers optimized for vertical recording may extend to relatively low frequencies, in other words they may have a small low corner frequency (LCF).

Typically, an AC amplifier includes a differential amplifier, as that of FIG. 2. A differential input signal is fed to the inputs INA and INB through respective decoupling input capacitors C. The architecture of this amplifier is very simple, but a sufficiently reduced LCF may be achieved using relatively large decoupling capacitors C.

Unfortunately, in integrated circuits, when the size of the decoupling capacitors C is enlarged, the parasitic capacitances CP1 and CP2 between the plates of the integrated capacitors, and the silicon substrate on which the amplifier is integrated, significantly increase. Thus, also, the input capacitance of the amplifier increases.

In order to keep parasitic capacitances below a maximum acceptable value, these relatively large DC-decoupling capacitors are fabricated with expensive techniques that may require additional masks and fabrication steps.

This drawback may be obviated with the AC amplifier disclosed in the European patent application No. 03425561.2 and depicted in FIGS. 3 and 4. It has been found possible to effectively decouple the DC component of the input signal by employing, for this purpose, decoupling capacitors in a position such that parasitic capacitances associated to the plates of decoupling capacitors do not degrade the input capacitance figure of the stage. The LCF is increased and effects of parasitic capacitances are reduced with the circuit of FIGS. 3 and 4 at the cost of increasing noise and current consumption (for an unchanged overall gain).

SUMMARY OF THE INVENTION

An architecture of an AC differential amplifier that, while providing for a desirably small input capacitance, restrains any increase of current consumption to practically maintain it identical to that of the prior art amplifier of FIG. 2 has now been found.

This result may be attained by connecting to the current nodes (for leaving unchanged the input capacitance) of the transistors of the differential pair, that amplifies the input differential signal, a degeneration network that constitutes with the first differential pair a high frequency feedback loop. The degeneration network may include a capacitive network and a second differential pair of transistors of an opposite type of conductivity to that of the first differential pair, and may be connected in series thereto, such that the same bias current of the first pair also biases the second pair.

The amplifier of the preferred embodiments overcomes the drawbacks of known amplifiers because its capacitive network does not alter the input capacitance of the differential input pair of transistors, because it is connected to the current nodes of the transistors and it is not in the path of the differential input signal, the low corner frequency (LCF) is determined by the capacitance of the capacitive network combined with the π resistance of the transistors of the second differential pair or with a resistance of the network and not by eventual parasitic capacitances, and the same bias current that flows through the first differential pair biases also the second differential pair. Thus, a single current generator is sufficient instead of two current generators as in the prior circuit of FIGS. 3 and 4.

BRIEF DESCRIPTION OF THE DRAWINGS

FIGS. 1a and 1b show sample power frequency spectra of signals used in longitudinal recording and vertical recording of HDDs, respectively as in the prior art.

FIG. 2 depicts a known AC amplifier as in the prior art.

FIG. 6b depicts Bode diagrams of the main parameters of the circuit of FIG. 6a.

FIG. 7b depicts Bode diagrams of the main parameters of the circuit of FIG. 7a.

FIG. 13b depicts Bode diagrams of the main parameters of the circuit of FIG. 13a.

FIG. 14b depicts Bode diagrams of the main parameters of the circuit of FIG. 14a.

DETAILED DESCRIPTION OF THE PREFERRED EMBODIMENTS

Figure 4:
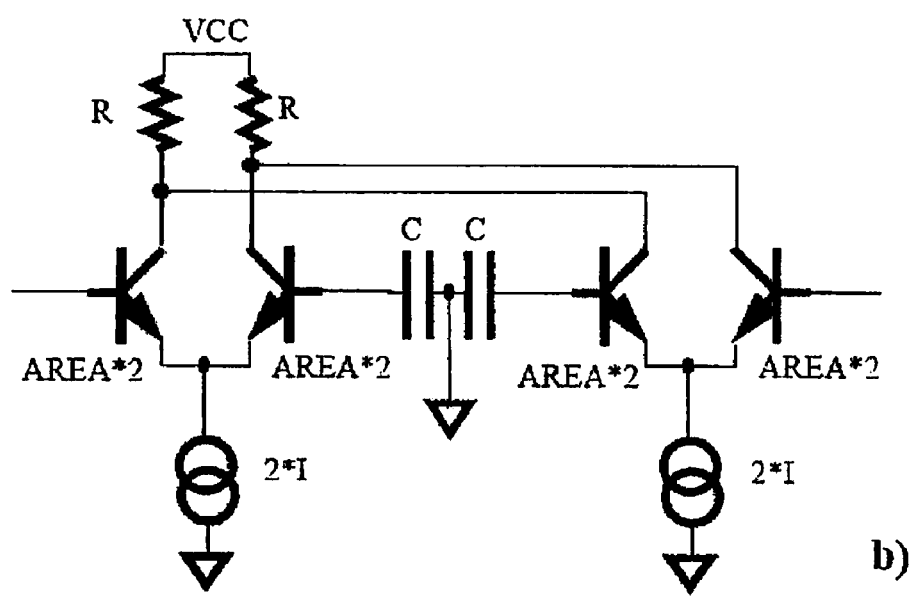
FIG. 4 shows a detailed embodiment of the amplifier of FIG. 3 as in the prior art.
Figure 5:
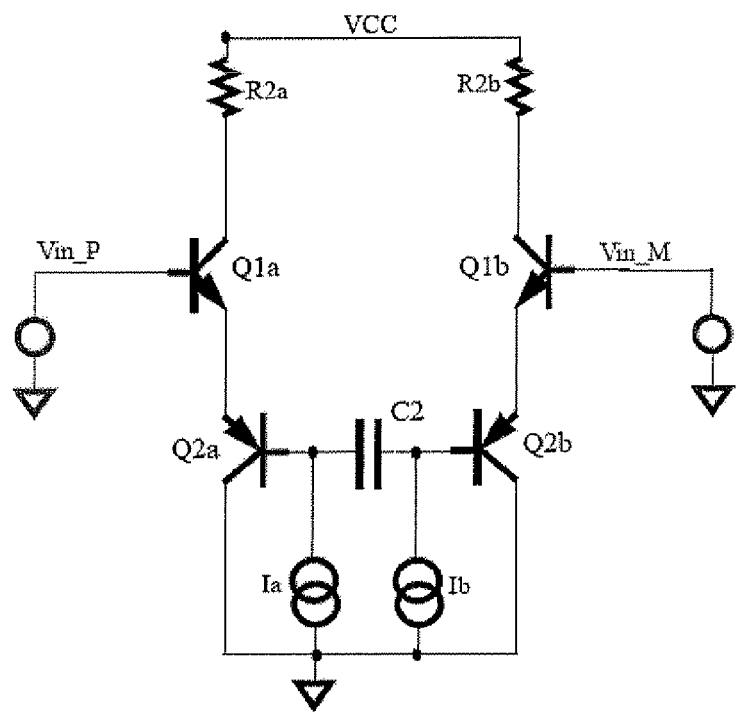
FIG. 5 shows a first embodiment of the integrated AC amplifier of this invention.

FIG. 5 depicts a first embodiment of the integrated AC amplifier with a small bias current. The proposed structure substantially includes a transconductance stage having a differential input pair of transistors Q1*a* and Q1*b*, that in the embodiment of FIG. 5 are two bipolar transistors NPN, connected to load resistors R2*a* and R2*b*, and a second differential pair of transistors Q2*a*, Q2*b*, each biased by the same current that flows in the respective input transistor Q1*a*, Q1*b*. The transistors of the second differential pair Q2*a*, Q2*b* are biased by dedicated bias means or current generators Ia and Ib, as in the case shown in FIG. 4.

Preferably, the currents Ia and Ib are fixed or controlled through a feedback loop for substantially nullifying the output offset voltage.

Figure 6A:
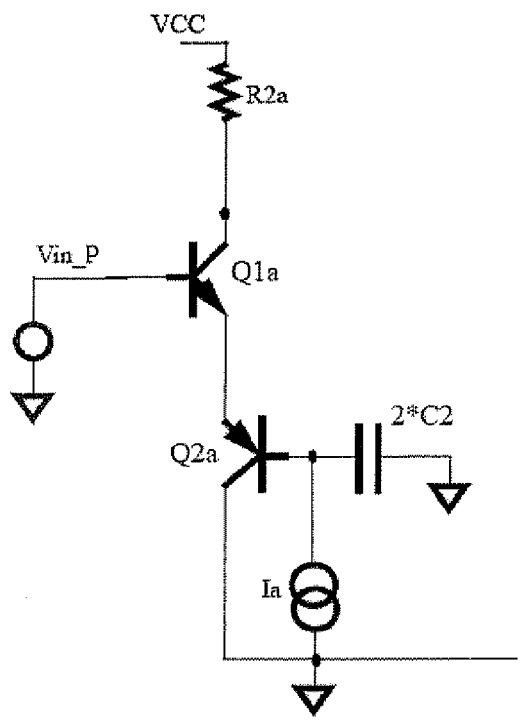
FIG. 6a is a single-ended architecture of an alternative embodiment of the integrated AC amplifier of this invention.

To better understand the functioning of the circuit of FIG. 5, let us refer to the single-ended circuit of FIG. 6*a*, that corresponds to a half of the integrated pre-amplifier. In the equivalent scheme, the capacitor C2 connected between the bases of the transistors of the second differential pair Q2*a*, Q2*b* is substituted with a capacitor of double capacitance 2*C2.

The gain of the amplifier is:

$$GAIN = Gm(s) \cdot Zload(s)$$

wherein Gm is the transconductance of the degenerated input stage and Zload is the impedance of the load R2*a*. Being gm1 and gm2 the transconductances of the transistors Q1*a* and Q2*a*, respectively, Zdeg the impedance of the degeneration network 2*C2, Q2*a*, Ia, seen from the emitter of the input transistor Q1*a*, and being β2 the current gain of the transistor Q2*a*, the gain of the transconductance stage is:

$$Gm(s) = \frac{gm_1}{1 + gm_1 \cdot Zdeg(s)}$$

wherein $$Zdeg(s) = \frac{1 + 2 \cdot s \cdot C2 \cdot R\pi 2}{2 \cdot s \cdot C2 \cdot (\beta 2 + 1)}$$

and $$Zload(s) = R2a$$

Figure 6B:
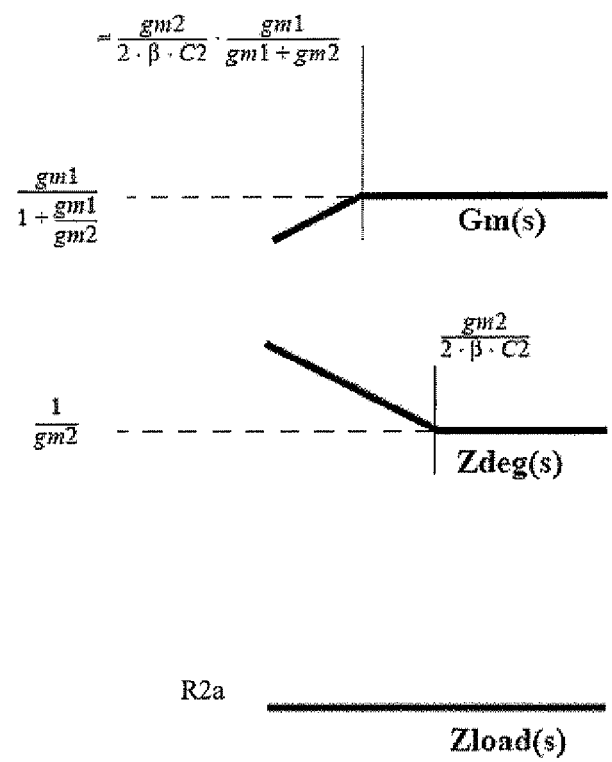

The Bode diagrams of Gm, Zdeg and Zload are depicted in FIG. 6*b*.

The low corner frequency of the circuit is given by the following formula:

$$LCF \approx \frac{gm2}{2 \cdot \beta \cdot C2} \cdot \frac{gm1}{gm1 + gm2}$$

$$\approx \frac{1}{2} \cdot \frac{gm2}{\beta} \cdot \frac{1}{2 \cdot C2}$$

$$\approx \frac{1}{2} \cdot \frac{1}{R\pi 2} \cdot \frac{1}{2 \cdot C2}$$

By contrast, the LCF of the prior circuit of FIG. 2 is:

$$LCF \approx \frac{1}{R\pi 2 \cdot C}$$

By biasing the proposed circuit with the same bias current used in the circuit of FIG. 2, the following condition is satisfied:

$$R\pi = R\pi 2$$

The same low corner frequency of the prior circuit of FIG. 2 may be attained with a single differential capacitor C2 four times smaller of each of the two single-end capacitors C. Moreover, parasitic capacitances of C2 are connected to nodes that, at high frequency, are grounded and do not influence the AC functioning of the amplifier.

Figure 3:
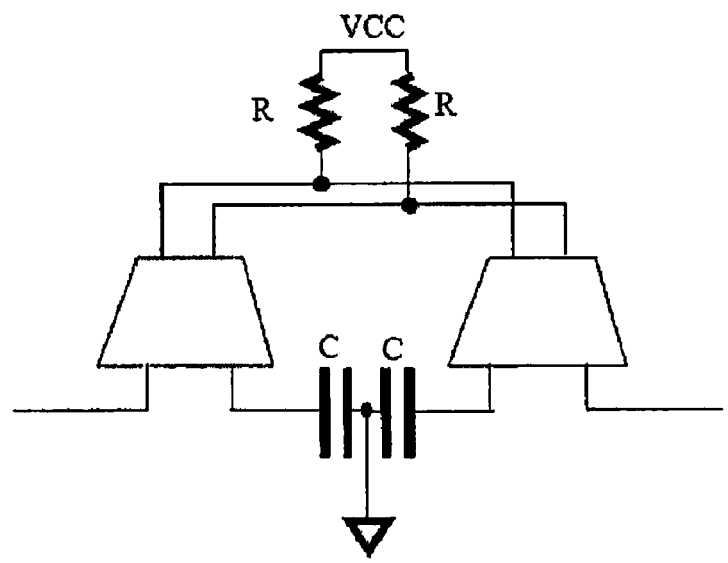
FIG. 3 shows an embodiment of a differential AC amplifier according to the European patent application No. 03425561.2 as in the prior art.

In practice, with the circuit of FIG. 5 or 6*a* it is possible to reduce the sensitivity to parasitic capacitances and obtain enhanced noise figures in respect to the prior circuit of FIG. 3, absorbing only half of the bias current. The pre-amplifiers of FIGS. 5 and 6*a* have the same power consumption of the known circuit of FIG. 2 but a larger band-pass and noise figures that are almost equal to that of the circuit of FIG. 2. This could be due to the fact that the transistors of the second differential pair Q2*a* and Q2*b* generate extra noise and for this reason the noise figures worsen. This worsening is relatively small, and it is largely compensated by the increase of bandpass and by reduction to sensitivity to parasitic capacitances.

Figure 7A:
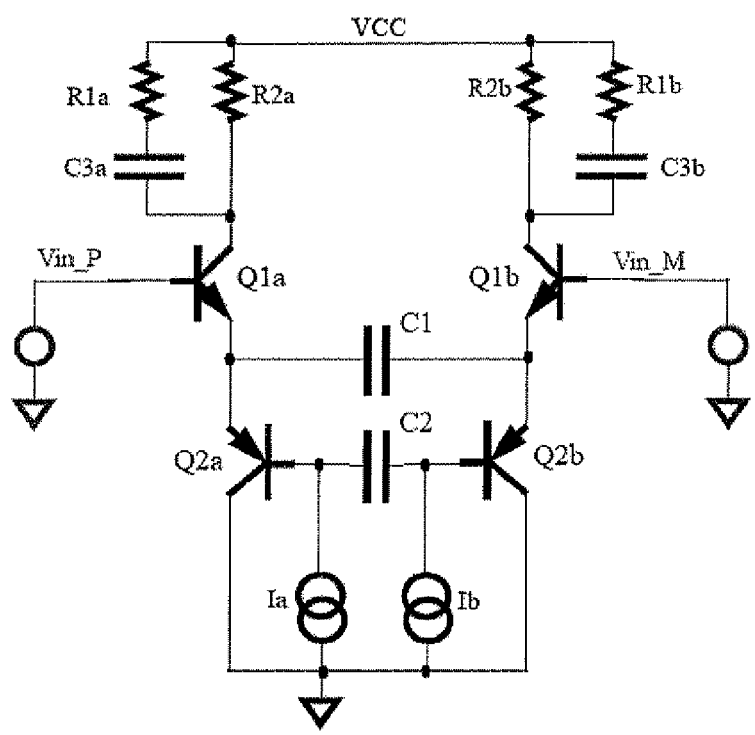
FIG. 7a is a single-ended architecture of another alternative embodiment of the integrated AC amplifier of this invention.

It is possible to limit degradation of noise immunity performances in the frequency range from 0 to gm2/(2*C1) using a capacitor C1, as depicted in FIG. 7*a*. The filters R1*a*, C3*a* and R1*b*, C3*b* are used to keep the frequency response substantially flat by compensating the zero-pole pair introduced by the capacitor C1.

The low-corner frequency is substantially unchanged in respect to the circuit of FIG. 6*a* or 5. The gain of the transconductance stage is:

$$Gm(s) = \frac{gm1}{1 + gm1 \cdot Zdeg(s)}$$

wherein $$Zdeg(s) = \frac{s + \frac{gm2}{2 \cdot \beta \cdot C2}}{s \cdot C1 \cdot \left(s + \frac{gm2}{2 \cdot C1} + \frac{gm2}{2 \cdot \beta \cdot C2}\right)}$$

and $$Zload(s) = R2a \cdot \frac{R1a}{R1a + R2a} \cdot \frac{s + \frac{1}{R1a \cdot C3}}{s + \frac{1}{(R1a + R2a) \cdot C3}}$$

Figure 7B:
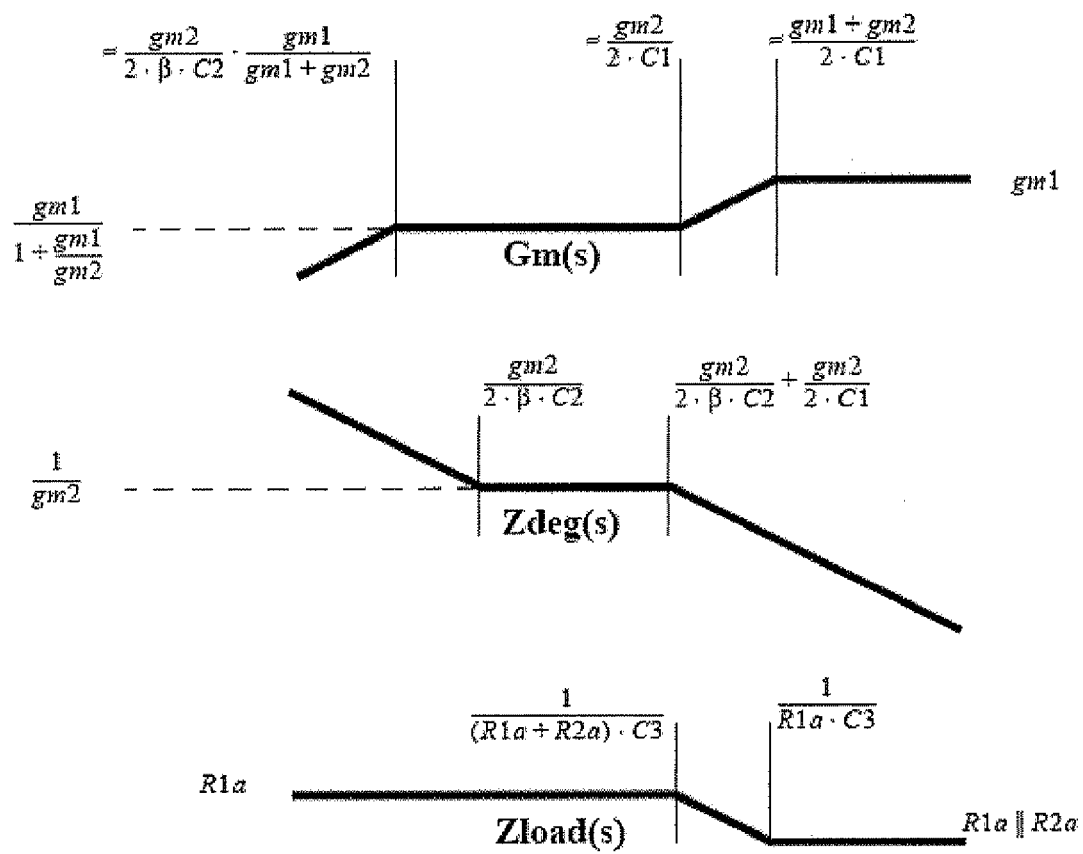

The Bode diagrams of Gm, Zdeg, Zload are depicted in FIG. 7*b*.

These three amplifiers are largely used for controlling hard disk drivers. Typically, the input of a pre-amplifier used in a hard disk drive is controlled by a transductor, commonly called a resistive head, the resistance of which depends on the magnetic field applied thereon. Generally, the resistive head is biased with a DC current. Thus, the voltage drop thereon is the sum of a DC component and of a signal that depends on the magnetic field.

Figure 8:
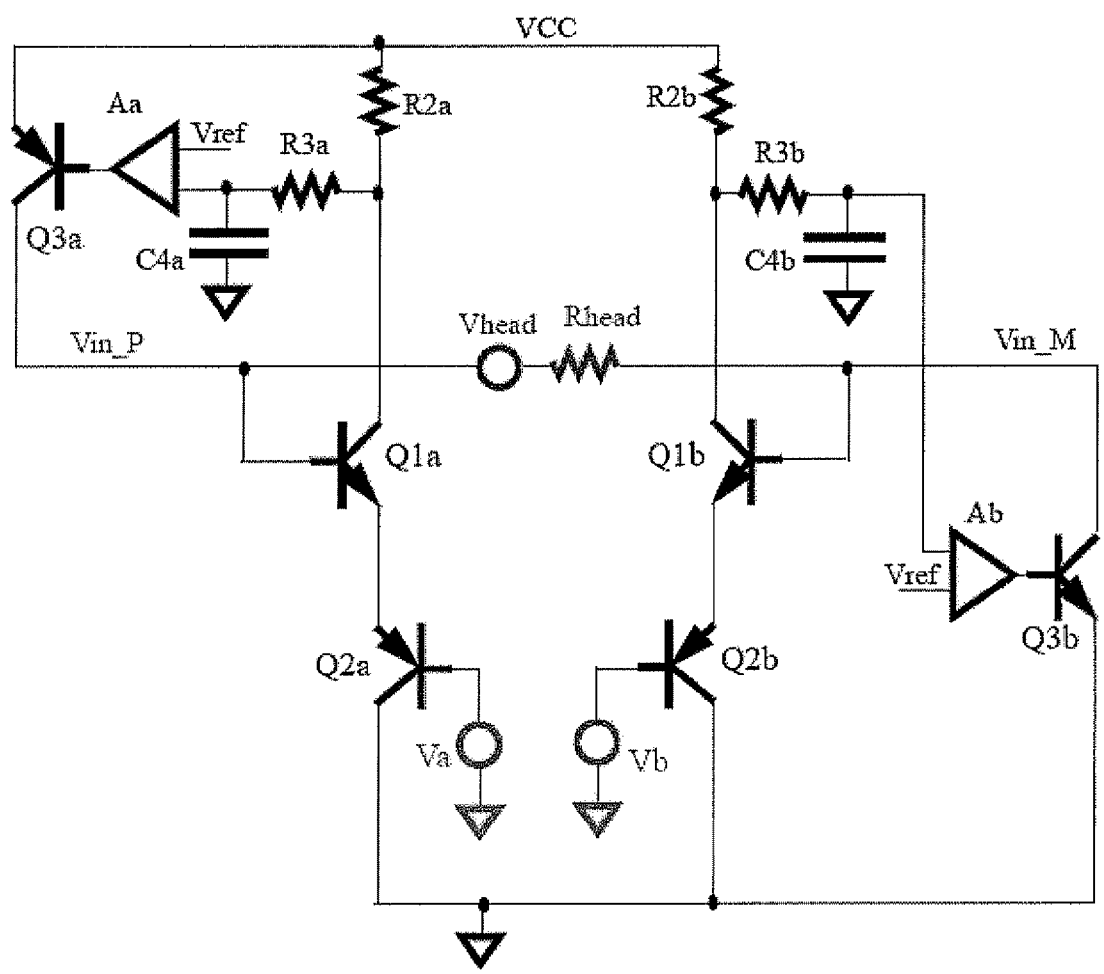
FIG. 8 is a single-ended architecture of yet another alternative embodiment of the integrated AC amplifier of this invention.

The magnetic field is generated by a constant current, and thus, the resistive head can be modeled as a constant voltage generator Vhead with a resistor Rhead connected in series therewith. The architectures of FIGS. 5, 6a and 7a can be modified as depicted in FIG. 8 for compensating the effects caused by the presence of the resistive head input to the differential pair Q1a and Q1b.

The two voltage generators Va and Vb fix the common mode voltage and the differential voltage applied to the resistive head. The DC current that flows through the transistors Q2a, Q1a and through the resistor R2a and through the transistors Q2b, Q1b and through the resistor R2b is fixed by elements present on the feedback lines, more precisely R3, C4, A, Q3. These feedback lines allow correction of both the common mode voltage and the offset voltage. The amplifier Aa does not absorb any input current, thus, DC current does not flow in the resistor R3a. As a consequence, there is a voltage drop across on the resistor R2a, the DC component of which is VCC-Vref. The DC component of the current that flows through the resistor R2a and through the transistors Q1a and Q2a is:

$$Ia = \frac{VCC - Vref}{R2a}$$

the RC pair, including the resistor R3a and the capacitor C4a, introduces a dominating pole that fixes the low corner frequency to the value:

$$LCF \approx \frac{1}{R3 \cdot C4}$$

Figure 9:
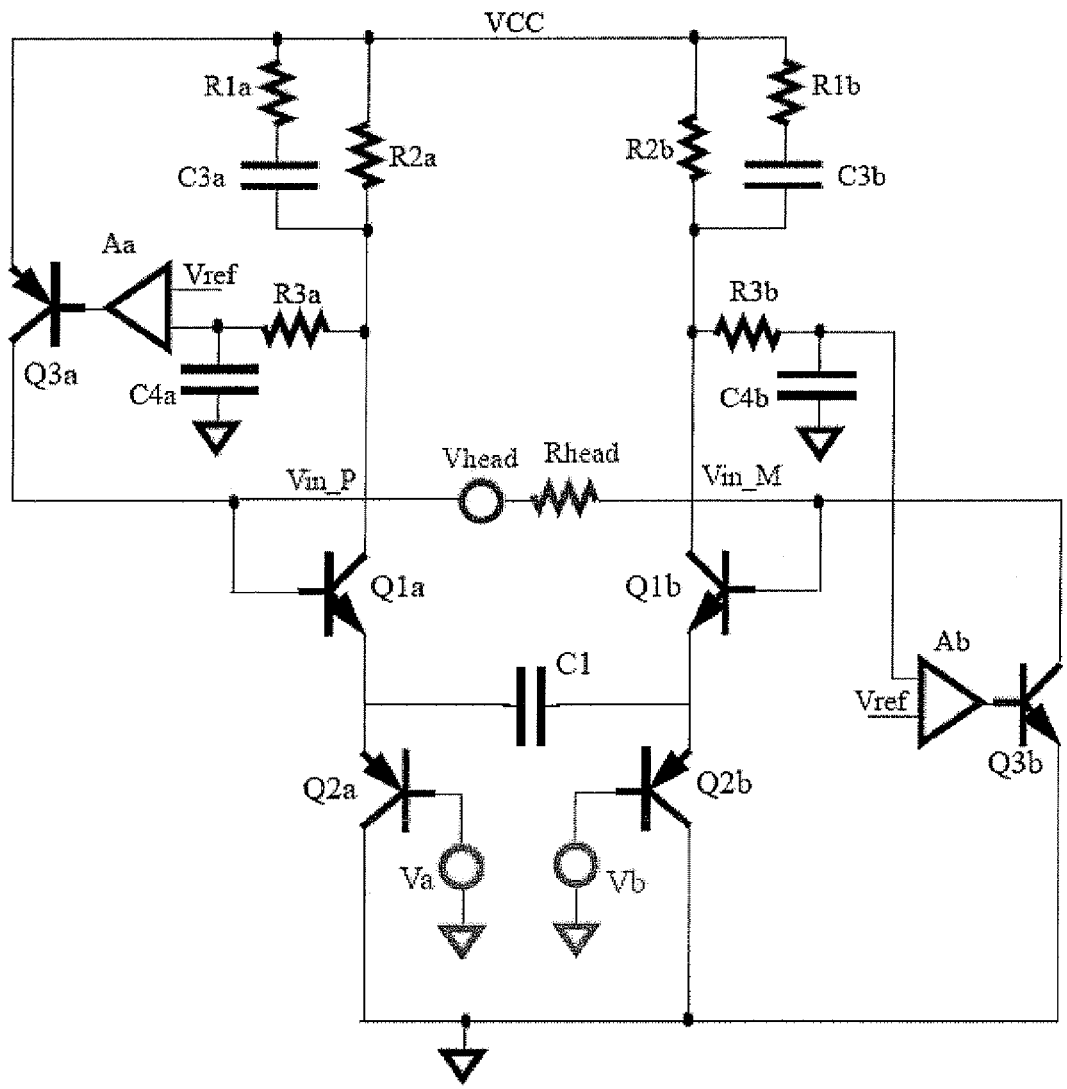
FIG. 9 is a single-ended architecture of a fifth alternative embodiment.

Alternatives of the circuit of FIG. 8 may be obtained by inserting a capacitor C1 between the emitters of the transistors of the second differential pair Q2a and Q2b, as depicted in FIG. 7a. By inserting RC pairs, including a resistor R1 in series to a capacitor C3, as shown in FIG. 7a, thus obtained the amplifier depicted in FIG. 9. The bias network could be as depicted in FIG. 5 or 7a, that includes two current generators Ia and Ib that ground the bases of the transistors of the second differential pair Q2a and Q2b, these two bases being connected by a capacitor C2, as shown above.

During the functioning of hard disk drives, the so-called thermal asperity effect (TA) may occur. During this phenomenon, the input DC offset voltage varies rapidly (in few nanoseconds), and thus, it returns relatively slowly (within few microseconds) to a normal value.

A widely used technique for reducing the effects of thermal asperity includes increasing the LCF when the thermal asperity starts and bringing this frequency back to its nominal value. The circuits depicted in FIGS. 8 and 9 may easily perform this task. Indeed, the low corner frequency, as stated above, is substantially fixed by the resistor R3a and by the capacitor C4a (the resistor R3b and the capacitor C4b are equal to the resistor R3a and to the capacitor C4a). Thus, it is sufficient, for example, to vary the resistance R3a (and the resistance R3b) for adjusting the value of the low corner frequency.

Figure 10:
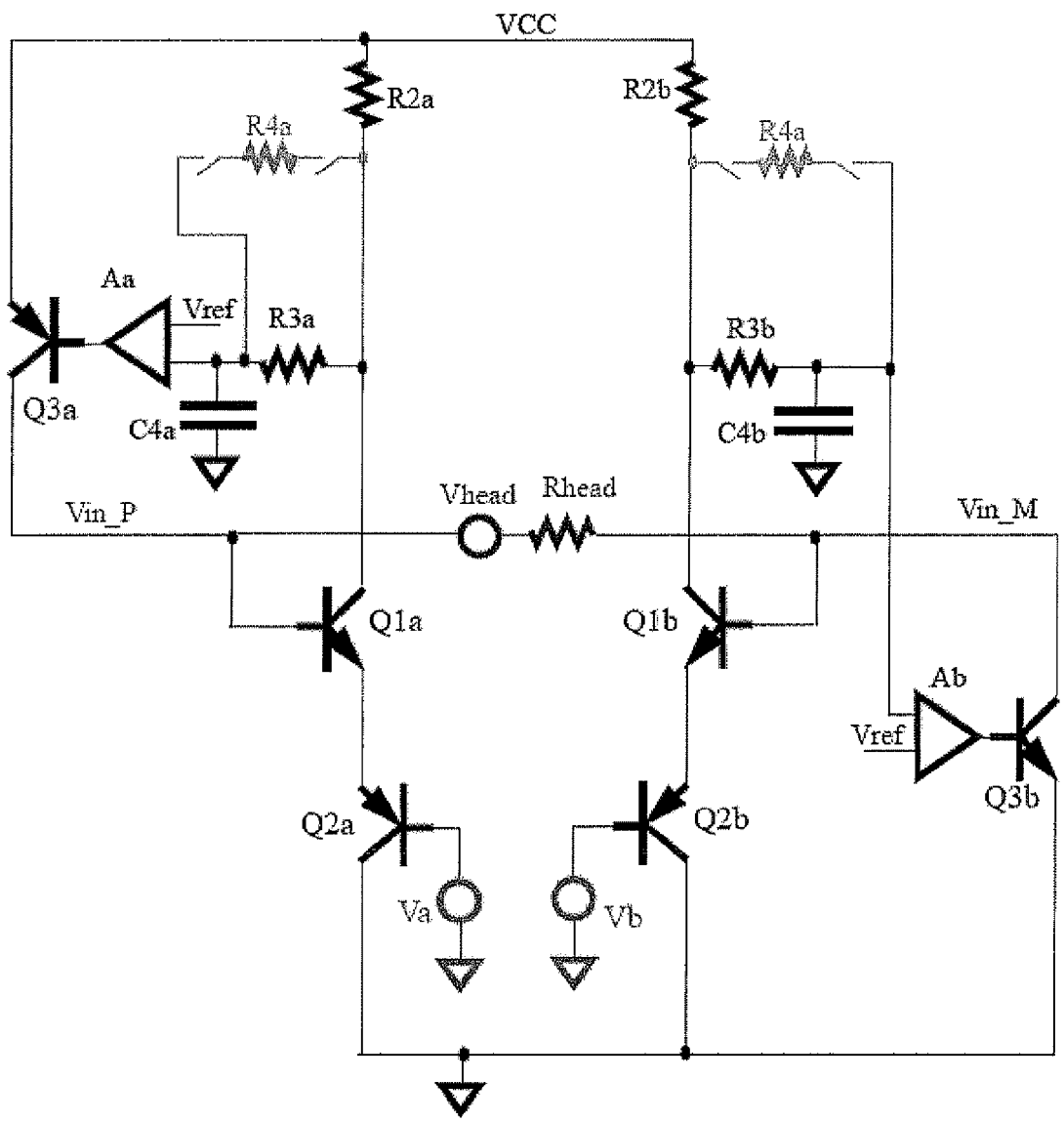
FIG. 10 is a single-ended architecture of a sixth alternative embodiment.
Figure 11:
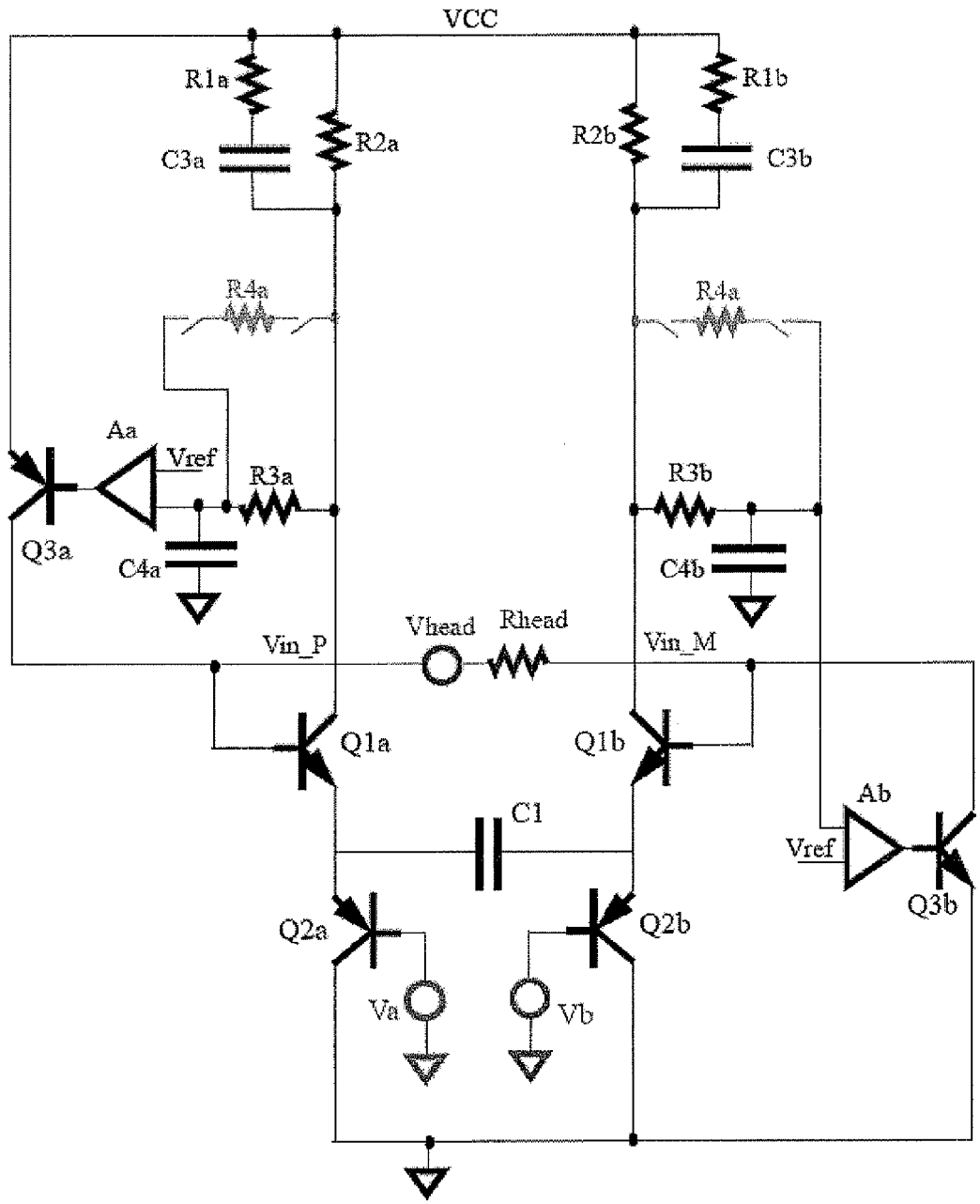
FIG. 11 is a single-ended architecture of a seventh alternative embodiment.

FIGS. 10 and 11 depict another two embodiments of the pre-amplifier, wherein there are two identical resistors R4a connected electrically in parallel to the resistors R3a and R3b, such that the resistor connected to the amplifiers Aa and Ab is reduced. As a consequence the low corner frequency of the pre-amplifier increases. These two additional resistors are connected electrically in parallel by closing the switches at the instant in which the thermal asperity effect takes place and are for being opened when the pre-amplifier returns in its normal functioning conditions.

Figure 12:
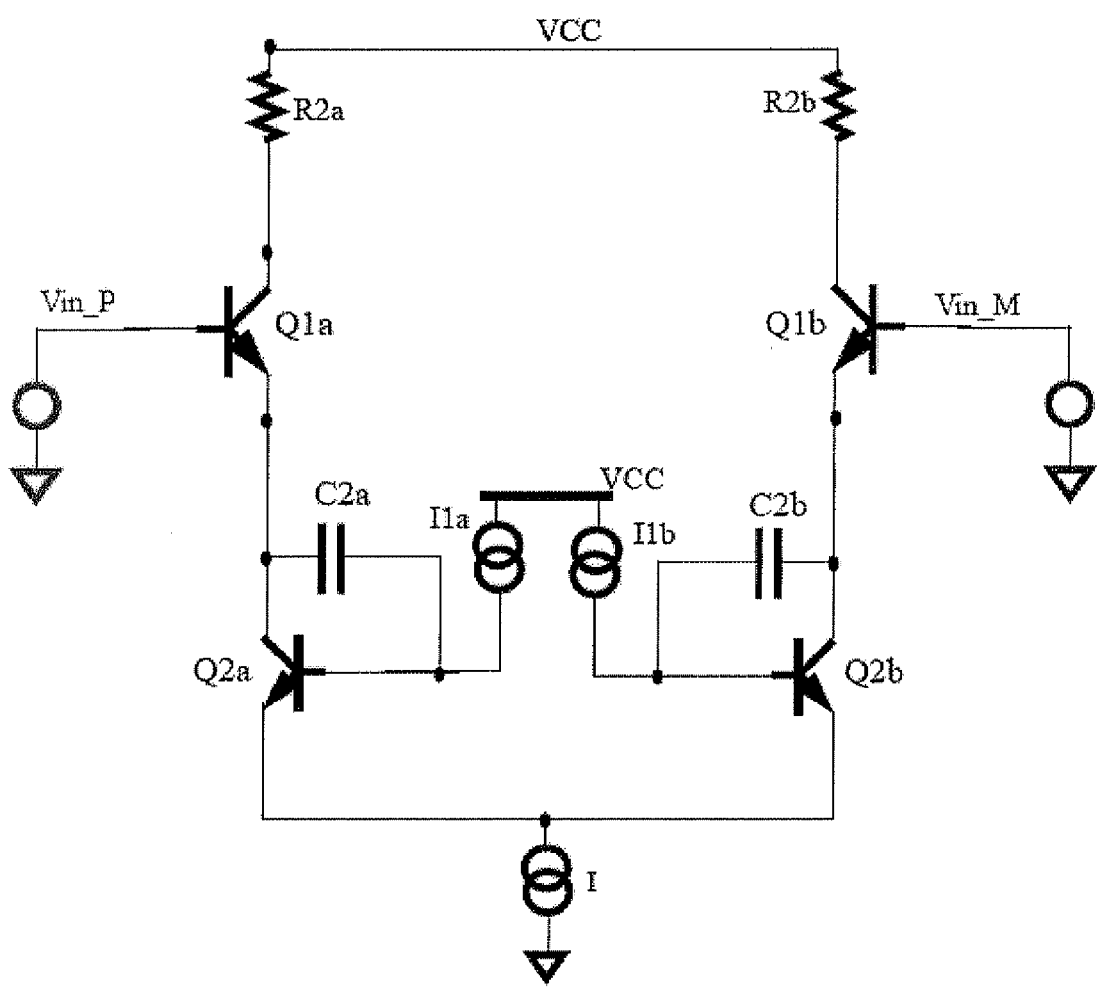
FIG. 12 is a single-ended architecture of an eighth alternative embodiment.
Figure 13A:
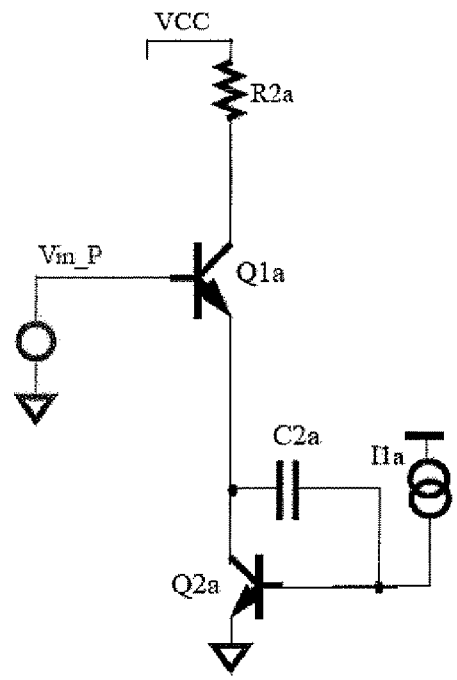
FIG. 13a is a single-ended architecture of a modified embodiment of the integrated AC amplifier of FIG. 12.
Figure 13B:
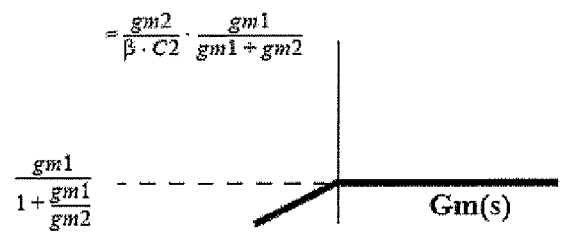
Figure 13B:
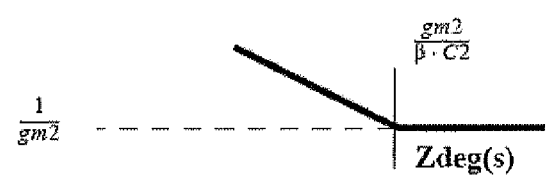

Another embodiment of the pre-amplifier is depicted in FIG. 12. Compared with the architecture depicted in FIG. 5, the current generators are not grounded, but are connected to the supply voltage line Vcc, and there is not a single capacitor that couples the bases of the transistors of the second differential pair Q2a and Q2b (that are NPN transistors and not PNP transistors). There are two identical transistors C2a and C2b connected between the base and the collector of the transistors of the second differential pair. The functioning of the circuit of FIG. 12 may be analyzed according to the circuit of FIG. 5, that is, referring to the circuit of FIG. 13a that depicts a single-end embodiment of the circuit of FIG. 12. Gm, Zdeg and Zload are given by the following equations:

$$Gm(s) = \frac{gm1}{1 + gm1 \cdot Zdeg(s)}$$

$$Zdeg(s) = \frac{1 + s \cdot C2 \cdot R\pi 2}{s \cdot C2 \cdot (\beta 2 + 1)}$$

$$Zload(s) = R2a$$

and the relative Bode diagrams are depicted in FIG. 13b. Even in this case, the low corner frequency is:

$$LCF \approx \frac{gm2}{\beta \cdot C2} \cdot \frac{gm1}{gm1 + gm2} \approx \frac{gm2}{\beta} \cdot \frac{1}{2 \cdot C2} \approx \frac{1}{R\pi 2} \cdot \frac{1}{2 \cdot C2}$$

and the considerations made referring to the circuit of FIG. 1a hold for the circuit of FIG. 6a.

Figure 14A:
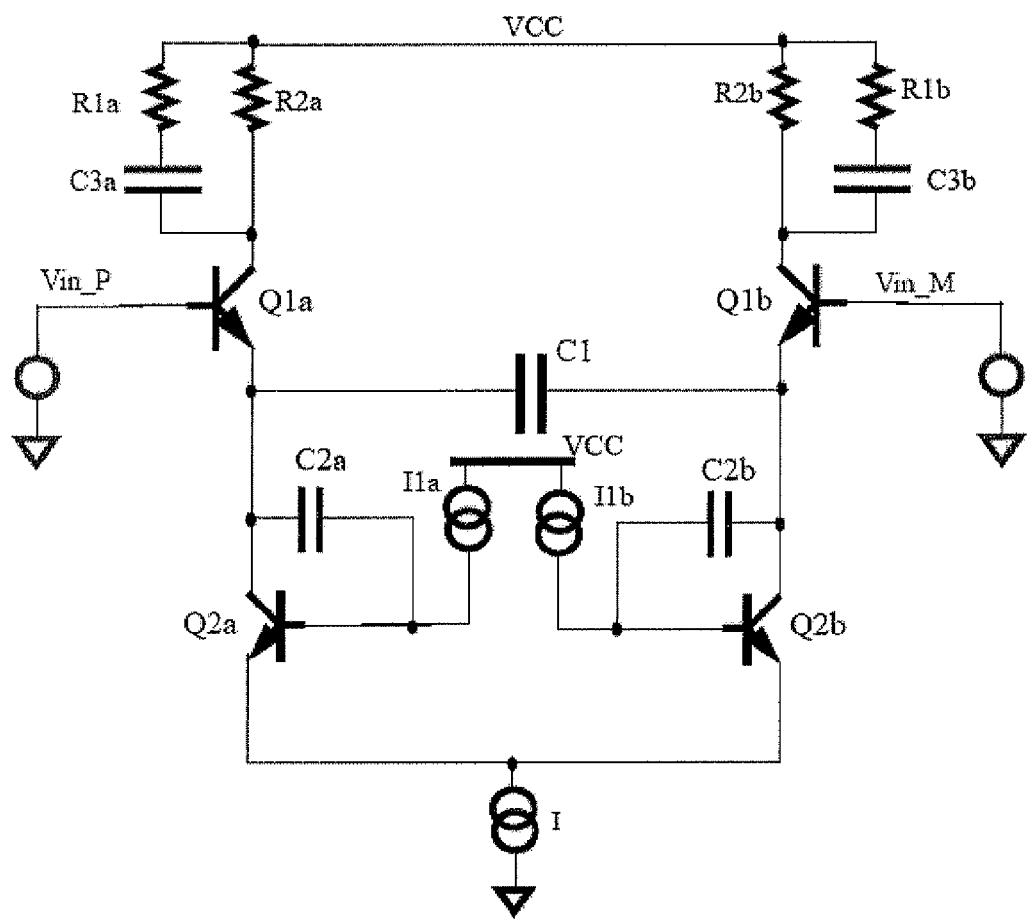
FIG. 14a is a single-ended architecture of a tenth alternative embodiment.

Alternatives of the circuit of FIG. 12 may be obtained by repeating the same observations made for the circuit of FIG. 5. Thus, the circuit of FIG. 14a is obtained with a capacitor C1 connected between the emitters of the transistors of the first input differential pair Q1a, Q1b and with the filters R1a, C3a, and R1b. C3b is for keeping the frequency response substantially flat.

Figure 14B:
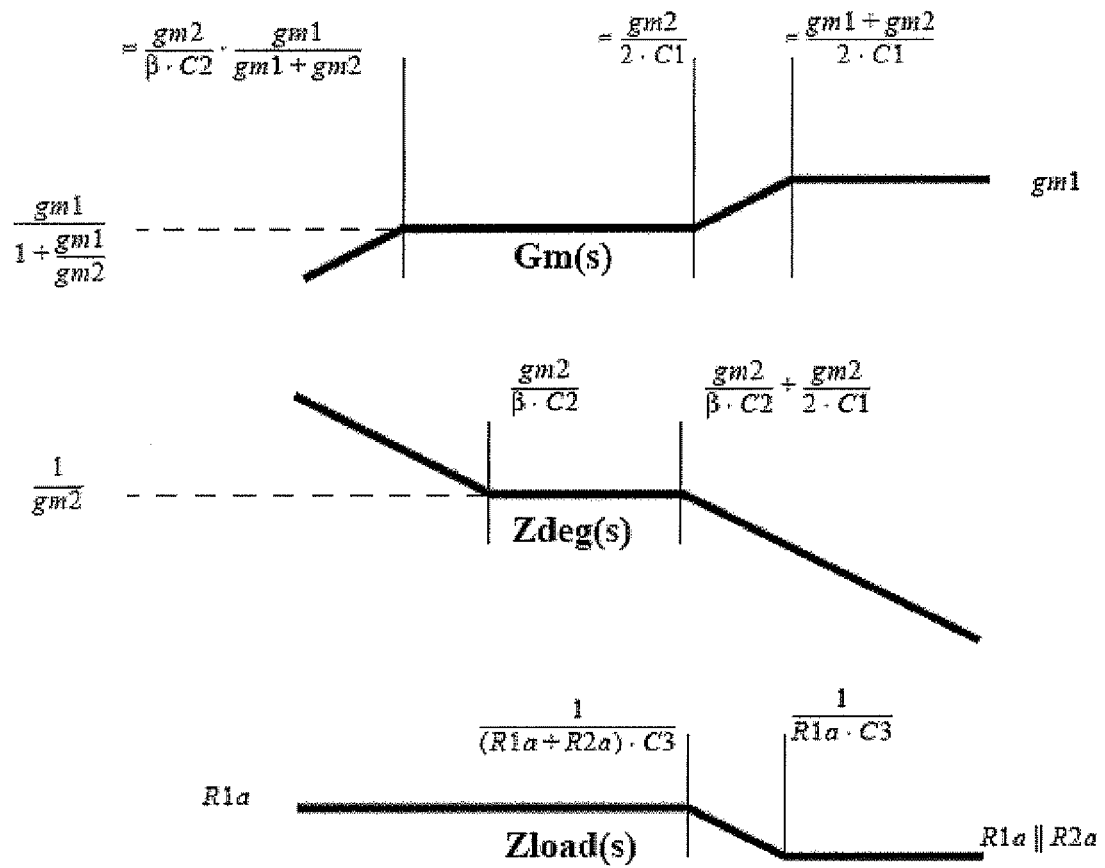

It is possible to demonstrate for the circuit of FIG. 14a that Zdeg and Zload are given by the following equations:

$$Zdeg(s) = \frac{s + \frac{gm2}{\beta \cdot C2}}{2 \cdot s \cdot C1 \cdot \left(s + \frac{gm2}{2 \cdot C1} + \frac{gm2}{\beta \cdot C2}\right)}$$

$$Zload(s) = R2a \cdot \frac{R1a}{R1a + R2a} \cdot \frac{s + \frac{1}{R1a \cdot C3}}{s + \frac{1}{(R1a + R2a) \cdot C3}}$$

and the relative Bode diagrams are depicted in FIG. 14b.

Figure 15:
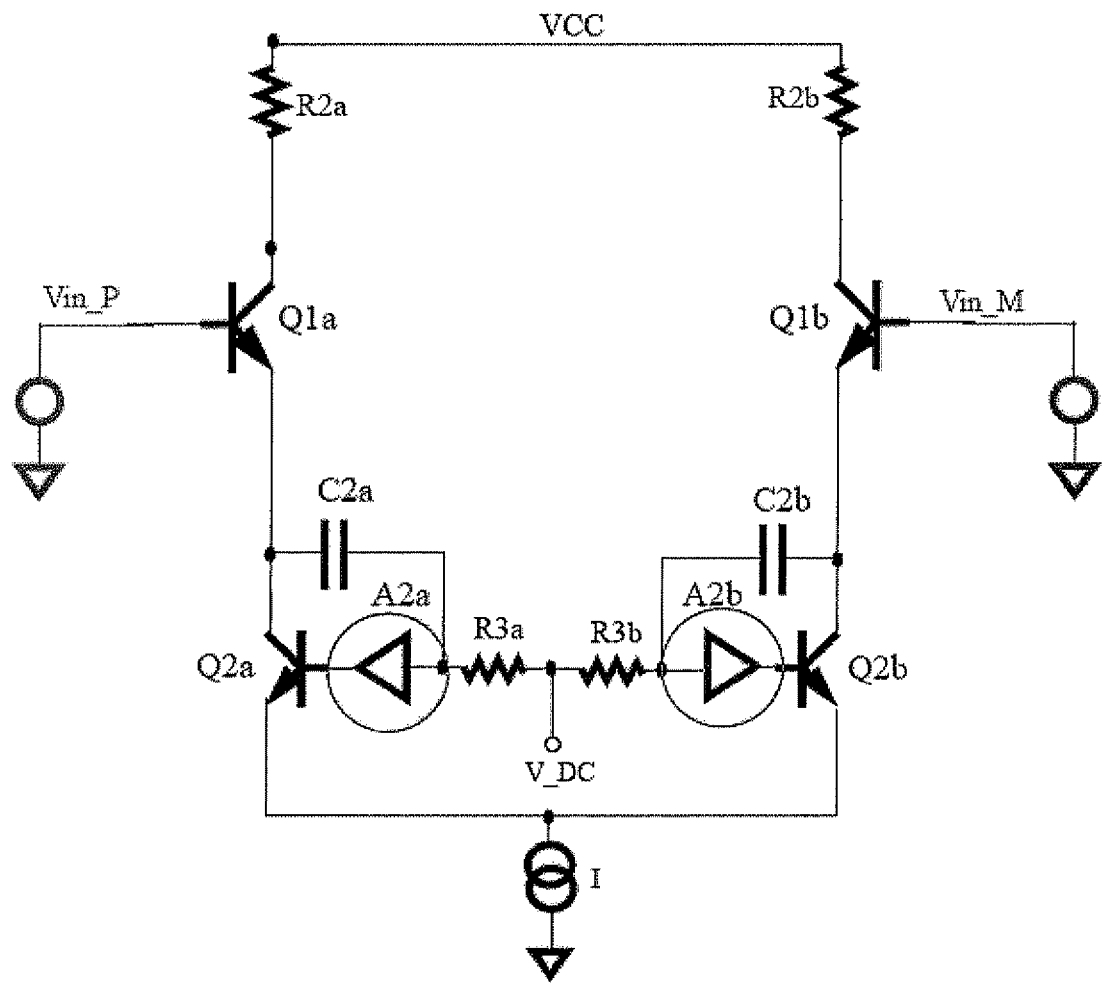
FIG. 15 is a single-ended architecture of an eleventh alternative embodiment.
Figure 16A:
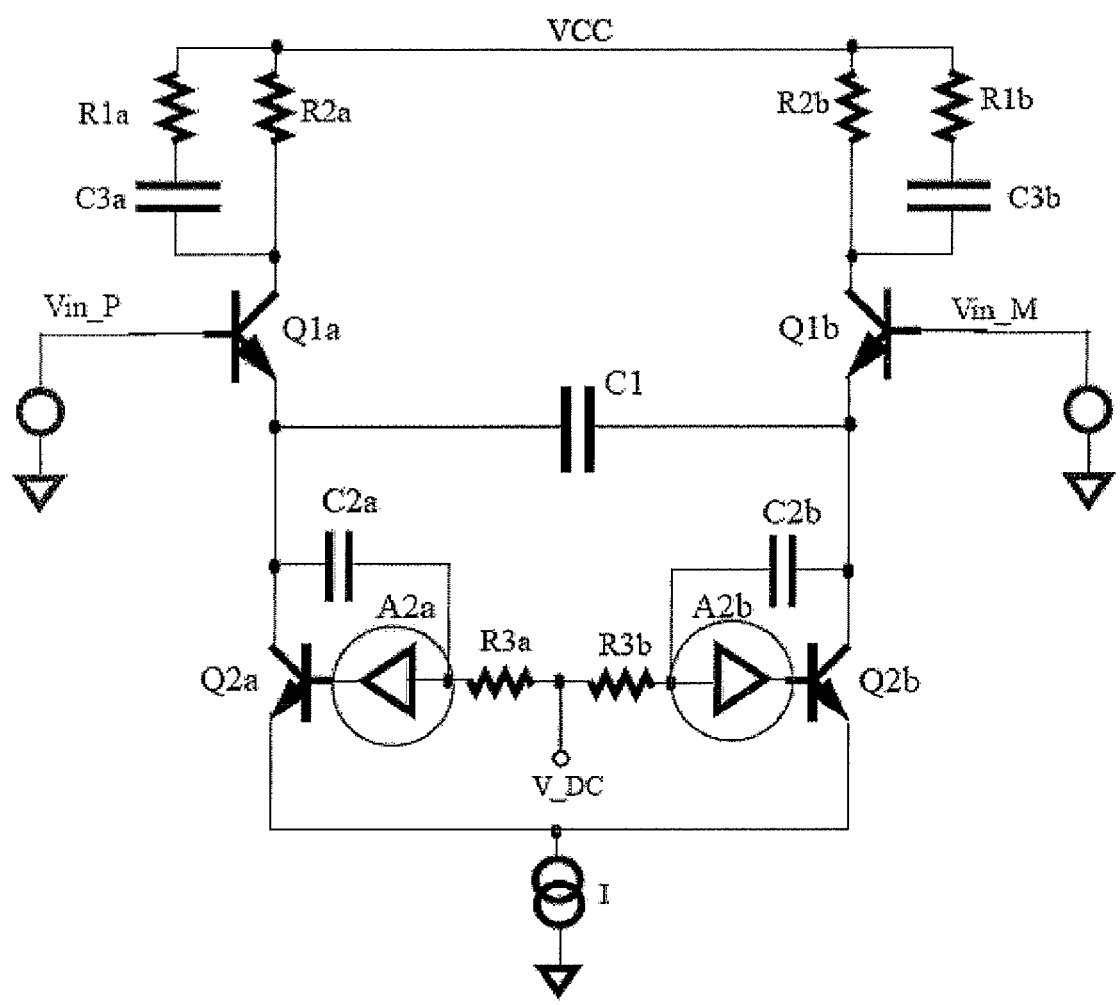
FIG. 16*a* is a single-ended architecture of a twelfth embodiment of the integrated AC amplifier with small bias current of this invention.

Instead of biasing the transistors of the second differential pair Q2a and Q2b with two current generators Ia and Ib, it is possible to use two buffers, as depicted in FIGS. 15 and 16a. The two buffers A2a and A2b are substantially voltage followers with high input impedance and drive the base terminals of the transistors of the second differential pair Q2a and Q2b. The resistors R3a and R3b fix the DC value of the base voltage of these two transistors. The voltage followers decouple the capacitor C2a (C2b) from the resistance $R\pi$ of the transistor Q2a (Q2b). It is possible to demonstrate that with this technique there is a pole at a frequency $1/(R3 \cdot C2)$ in the Bode diagram of the gain. By contrast, without the voltage follower this pole is at the frequency:

$$\frac{gm2}{\beta \cdot C2} = \frac{1}{R\pi \cdot C2}$$

Because the resistance R3 may be much greater than the resistance Rπ of the transistors of the second differential pair, it is possible to reduce the low corner frequency, thus also reducing noise sensitivity.

Figure 16B:
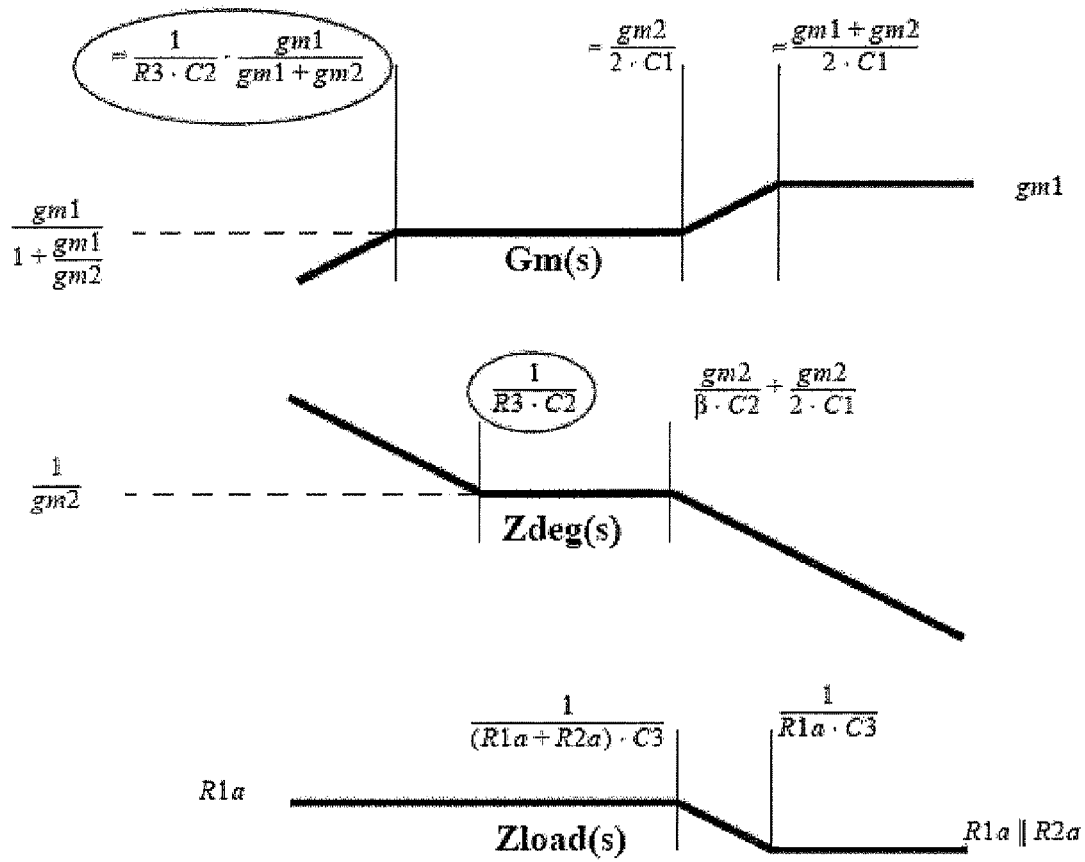
FIG. 16*b* depicts Bode diagrams of the main parameters of the circuit of FIG. 16*a*.
Figure 17:
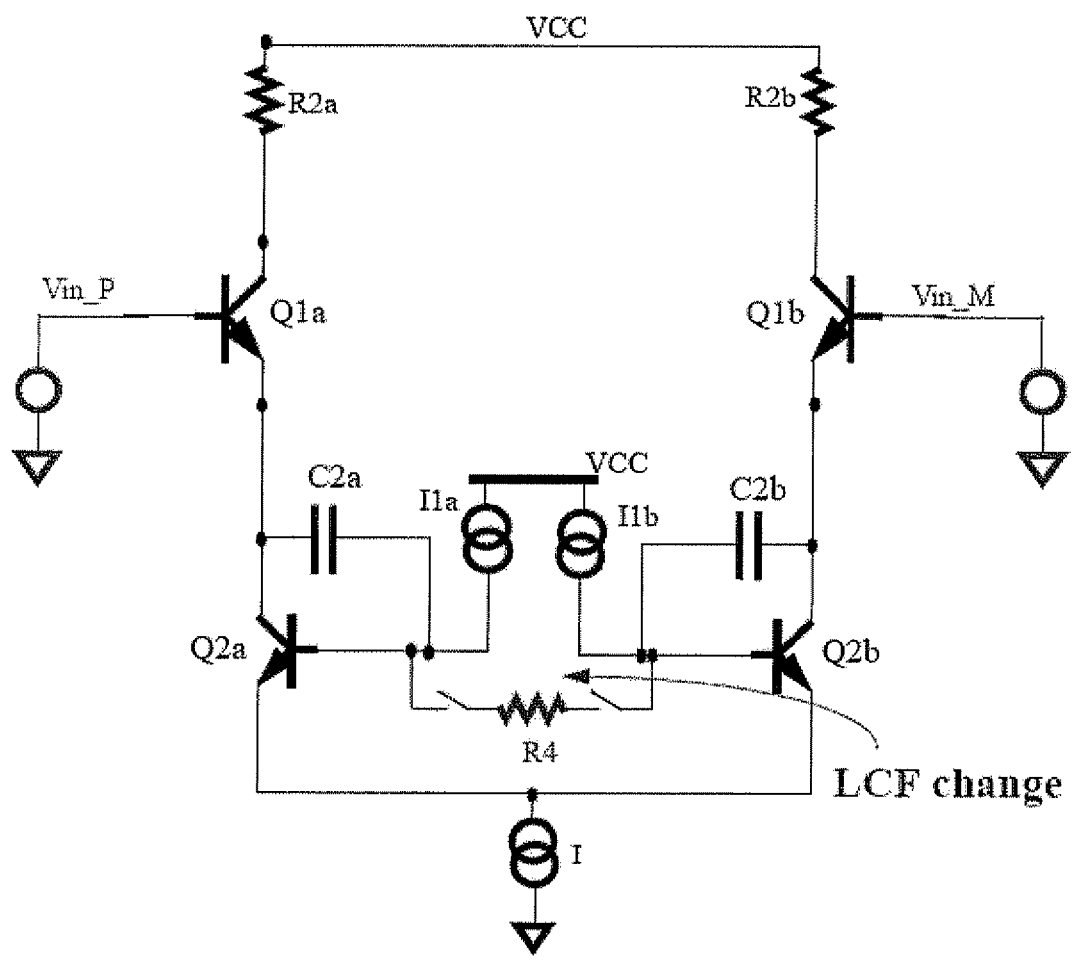
FIGS. 17 to 20 depict yet other embodiments of the integrated AC amplifier of this invention.
Figure 18:
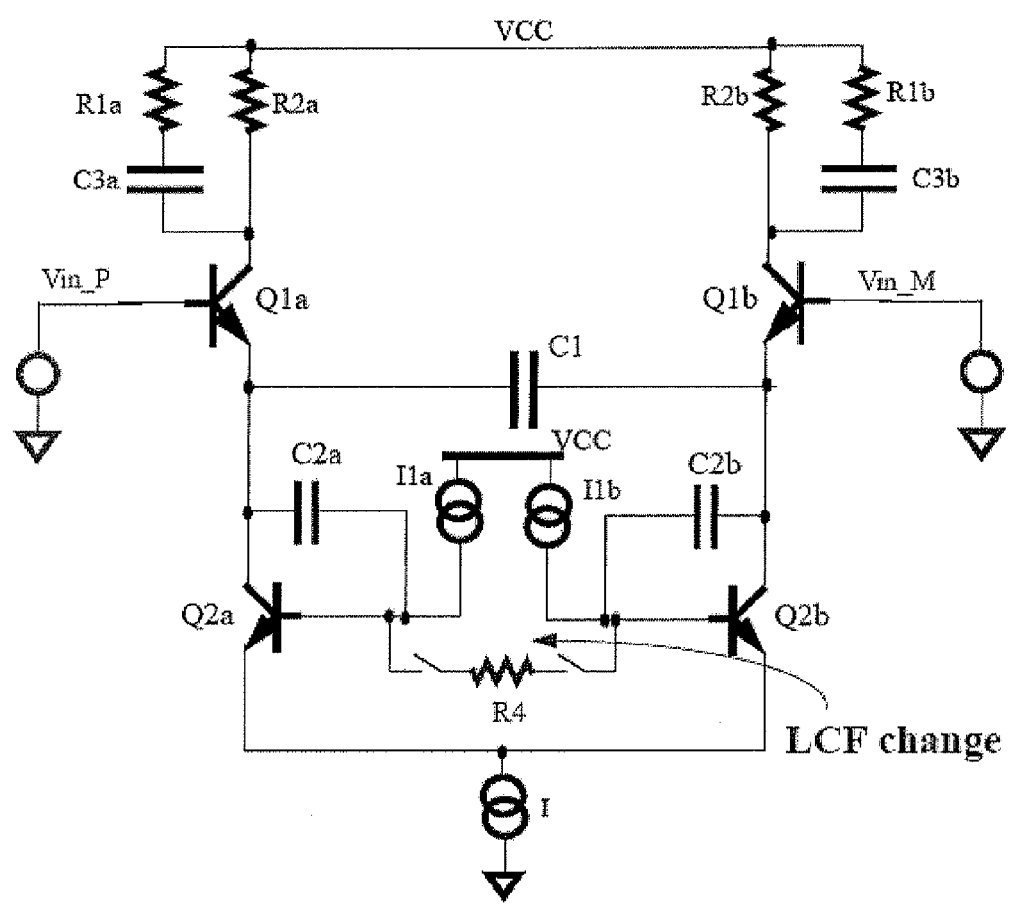
Figure 19:
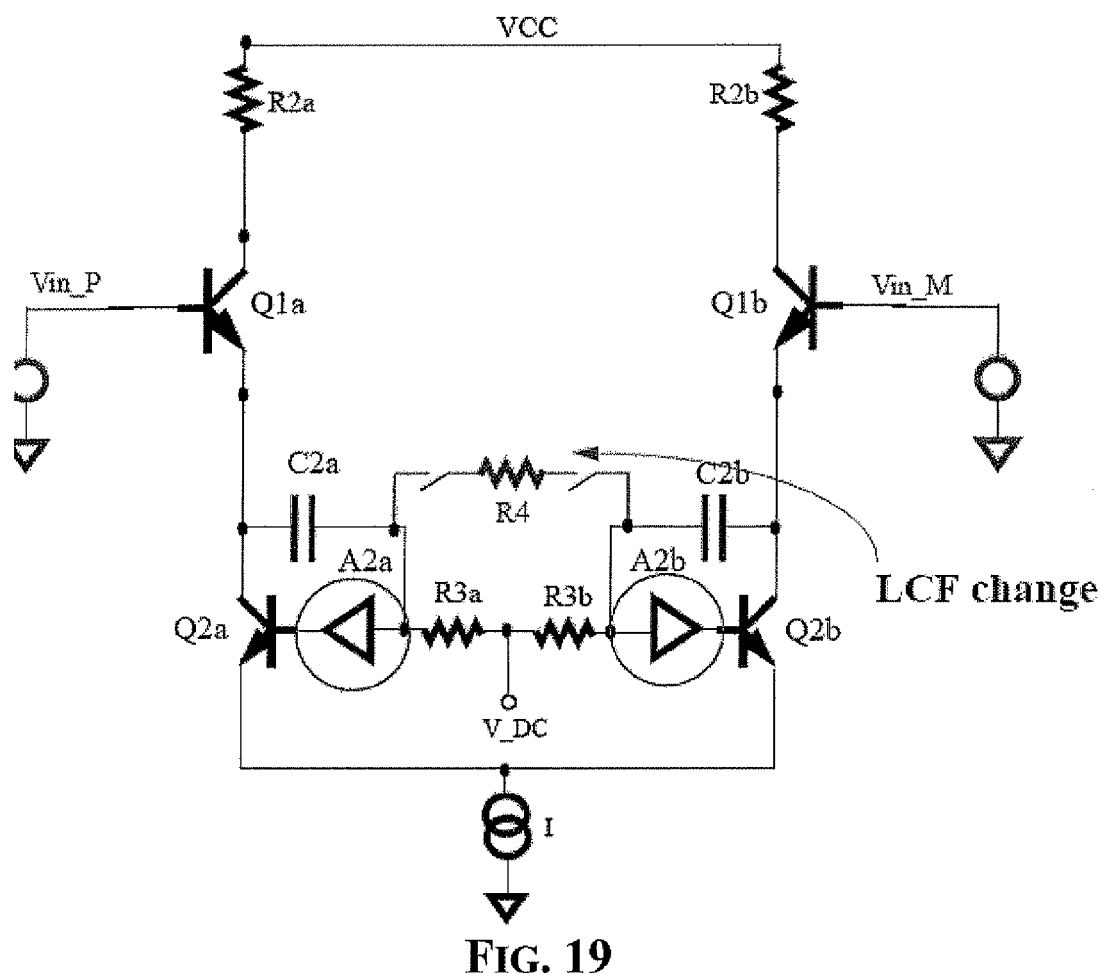
Figure 20:
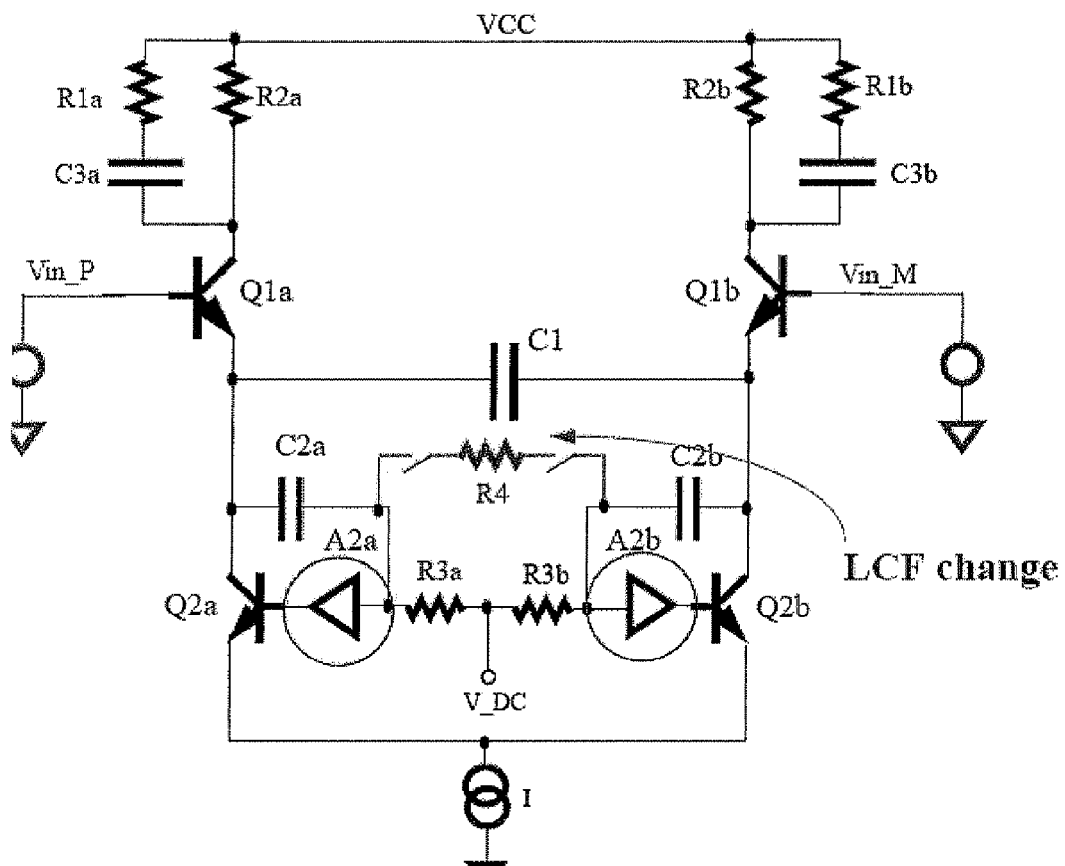

This reduction of the low corner frequency is obtained at the cost of increasing the power absorbed by the voltage follower. The parameters Gm, Zdeg and Zload are given by the following equations:

$$Gm(s) = \frac{gm1}{1 + gm1 \cdot Zdeg(s)}$$

$$Zdeg(s) = \frac{s + \frac{1}{R3 \cdot C2}}{2 \cdot s \cdot C1 \cdot \left(s + \frac{gm2}{2 \cdot C1} + \frac{1}{R3 \cdot C2}\right)}$$

$$Zload(s) = R2a \cdot \frac{R1a}{R1a + R2a} \cdot \frac{s + \frac{1}{R1a \cdot C3}}{s + \frac{1}{(R1a + R2a) \cdot C3}}$$

and the respective Bode diagrams are depicted in FIG. 16b.

For the circuit of FIG. 12, the low corner frequency is estimated by the following formula:

$$LCF \approx \frac{1}{R\pi 2} \cdot \frac{1}{2 \cdot C2}.$$

For the circuits of FIGS. 15 and 16a the LCF is:

$$LCF \approx \frac{1}{R3} \cdot \frac{1}{2 \cdot C2}.$$

Even the pre-amplifiers of these two embodiments can be adapted to obviate the problems due to the thermal asperity. By connecting a resistor R4, as depicted in FIGS. 17 to 20, the resistance seen from capacitors C2a and C2b is reduced and, as a consequence, the low corner frequency is increased.

Other architectures of pre-amplifiers can be obtained by combining features of the embodiments discussed above. For example, the amplifiers depicted in FIG. 8 (Aa, Ab), and the respective R-C input branches could also be connected to the amplifiers depicted in FIGS. 18 to 20 for compensating the effects induced by the resistive heads.

That which is claimed is:

1. An integrated amplifier comprising:
 a transconductance stage comprising a differential pair of input transistors of a first type of conductivity, respective resistive loads coupled to said input transistors, and a first bias circuit coupled to said input transistors;
 said first bias circuit comprising
  a second differential pair of bias transistors having first conduction terminals coupled in common and second conduction terminals coupled to respective conduction terminals of said input transistors,
  respective second bias circuits coupled to said bias transistors to enable said input transistors in a conduction state with said input transistors being biased by a same respective bias current that flows through the respective input transistors, and
  a capacitive network coupled to said bias transistors to define with said input transistors a feedback loop.

2. The integrated amplifier of claim 1, wherein said input transistors comprise control terminals coupled to a differential input signal.

3. The integrated amplifier of claim 1, wherein said bias transistors have a second conductivity type associated therewith opposite the first type of conductivity; and wherein the first conduction terminals of said bias transistors comprise collector terminals coupled to a common reference node.

4. The integrated amplifier of claim 3, wherein said capacitive network comprises a first capacitor coupled between respective control terminals of said bias transistors.

5. The integrated amplifier of claim 3, wherein said second bias circuits comprise two current generators each coupled to the common reference node and coupled to the respective control terminals of said bias transistors.

6. The integrated amplifier of claim 3, further comprising:
 voltage generators coupled to the common reference node to bias control terminals of said bias transistors;
 two low-pass filters to filter voltages generated on conduction terminals of the each of said input transistors;
 first and second differential amplifiers each input with a voltage generated by each low-pass filter and a reference voltage;
 a pre-amplifier; and
 first and second feedback transistors of opposite conductivity type, control terminals of which are controlled by a respective voltage generated by said first and second differential amplifiers, conduction terminals of said first feedback transistor coupled to a supply line and a first input terminal of said pre-amplifier, conduction terminals of said second feedback transistor coupled to said voltage generators and to a second input terminal of said pre-amplifier.

7. The integrated amplifier of claim 6, wherein each of said low-pass filters comprises an R-C filter comprising a resistor; and further comprising a respective
 configuration switch configured to change an input resistance of each R-C filter.

8. The integrated amplifier of claim 1, further comprising a first bias current generator; wherein said bias transistors have the first conductivity type; and wherein the first conduction terminals of said bias transistors comprise emitter terminals coupled to said first bias current generator.

9. The integrated amplifier of claim 8, wherein said capacitive network comprises two capacitors each coupled between a control terminal of each of said bias transistors and a respective second conduction terminal; and wherein said second bias circuits comprise a second and a third current generator each coupled to the control terminal of one of said bias transistors.

10. The integrated amplifier of claim 8, further comprising:
 two voltage buffers to each control a control terminal of each of said bias transistors and having an input terminal associated therewith;
 two capacitors each coupled between the input terminal of respective ones of said two voltage buffers and the second conduction terminal of one of said bias transistors controlled thereby; and two resistors each coupled to the input terminal of respective ones of said two voltage buffers and a constant voltage node.

11. The integrated amplifier of claim 10, comprising a selectable resistor coupled to said two capacitors and isolated from the respective second conduction terminals of said bias transistors.

12. The integrated amplifier of claim 11, wherein said capacitive network further comprises a second capacitor coupled between respective conduction terminals of said input transistors and the respective resistive loads; and wherein the respective resistive loads comprise R-C pairs.

13. An integrated amplifier comprising:
a transconductance stage comprising a differential pair of bipolar input transistors of a first type of conductivity and having control terminals coupled to a differential input signal, respective resistive loads coupled to said bipolar input transistors, and a first bias circuit coupled to said bipolar input transistors;
said first bias circuit comprising
a second differential pair of bipolar bias transistors having first conduction terminals coupled in common and second conduction terminals coupled to respective conduction terminals of said bipolar input transistors,
respective second bias circuits coupled to said bipolar bias transistors to enable said bipolar input transistors in a conduction state with said bipolar input transistors being biased by a same respective bias current that flows through the respective bipolar input transistors, and
a capacitive network coupled to said bipolar bias transistors to define with said input transistors a feedback loop.

14. The integrated amplifier of claim 13, wherein said bipolar bias transistors have a second conductivity type associated therewith opposite the first type of conductivity; and wherein the first conduction terminals of said bipolar bias transistors comprise collector terminals coupled to a common reference node.

15. The integrated amplifier of claim 14, wherein said capacitive network comprises a first capacitor coupled between respective control terminals of said bipolar bias transistors.

16. The integrated amplifier of claim 14, wherein said second bias circuits comprise two current generators each coupled to the common reference node and coupled to the respective control terminals of said bipolar bias transistors.

17. The integrated amplifier of claim 14, further comprising:
voltage generators coupled to the common reference node to bias control terminals of said bias transistors;
two low-pass filters to filter voltages generated on conduction terminals of the each of said input transistors;
first and second differential amplifiers each input with a voltage generated by each low-pass filter and a reference voltage;
a pre-amplifier; and
first and second feedback transistors of opposite conductivity type, control terminals of which are controlled by a respective voltage generated by said first and second differential amplifiers, conduction terminals of said first feedback transistor coupled to a supply line and a first input terminal of said pre-amplifier, conduction terminals of said second feedback transistor coupled to said voltage generators and to a second input terminal of said pre-amplifier.

18. A method of biasing a transconductance stage comprising a differential pair of input transistors of a first type of conductivity, and respective resistive loads coupled thereto, the method comprising:
coupling a first bias circuit to the input transistors comprising
a second differential pair of bias transistors having first conduction terminals coupled in common and second conduction terminals coupled to respective conduction terminals of the input transistors,
respective second bias circuits to the bias transistors to enable the input transistors in a conduction state with the input transistors being biased by a same respective bias current that flows through the respective input transistors, and
a capacitive network to the bias transistors to define with the input transistors a feedback loop.

19. The method of claim 18, wherein the input transistors comprise control terminals coupled to a differential input signal.

20. The method of claim 18, wherein the input transistors and the bias transistors comprise bipolar transistors.

* * * * *

UNITED STATES PATENT AND TRADEMARK OFFICE
CERTIFICATE OF CORRECTION

PATENT NO. : 7,602,250 B1
APPLICATION NO. : 12/017694
DATED : October 13, 2009
INVENTOR(S) : Bollati et al.

It is certified that error appears in the above-identified patent and that said Letters Patent is hereby corrected as shown below:

Column 4, Line 14   Delete: "smaller of"
Insert: --smaller than--

Column 6, Line 34   Delete: "1a"
Insert: --13a--

Column 8, Line 45-47   Delete:
"and further comprising a respective
configuration switch configured to change an input resistance of
each R-C filter."
Insert:
--and further comprising a respective configuration switch
configured to change an input resistance of each R-C filter.--

Column 10, Line 8   Delete: "the"

Signed and Sealed this

Seventh Day of September, 2010

David J. Kappos
*Director of the United States Patent and Trademark Office*